United States Patent [19]

Warner

[11] Patent Number: 4,766,334
[45] Date of Patent: Aug. 23, 1988

[54] LEVEL CLAMP FOR TRI-STATE CMOS BUS STRUCTURE

[75] Inventor: Richard C. Warner, Morris Plains, N.J.

[73] Assignee: The Singer Company, Stamford, Conn.

[21] Appl. No.: 20,184

[22] Filed: Feb. 27, 1987

Related U.S. Application Data

[63] Continuation of Ser. No. 849,049, Mar. 7, 1986, abandoned.

[51] Int. Cl.[4] .................. H03K 5/08; H03K 19/003; H03K 19/094
[52] U.S. Cl. .................. 307/540; 307/443; 307/473; 307/568; 307/572
[58] Field of Search ............ 307/473, 279, 550, 555, 307/572, 568, 443, 540

[56] References Cited

U.S. PATENT DOCUMENTS

| 4,158,891 | 6/1979 | Fisher | 307/473 |
| 4,450,370 | 5/1984 | Davis | 307/473 |
| 4,594,519 | 6/1986 | Ohtani et al. | 307/473 |

FOREIGN PATENT DOCUMENTS

| 0025419 | 2/1984 | Japan | 307/473 |

Primary Examiner—John Zazworsky
Attorney, Agent, or Firm—David L. Davis

[57] ABSTRACT

A combination non-inverting driver and a resistor ensures the locking of a free floating bus line of a CMOS system into whatever logic state the bus line was last driven.

4 Claims, 4 Drawing Sheets

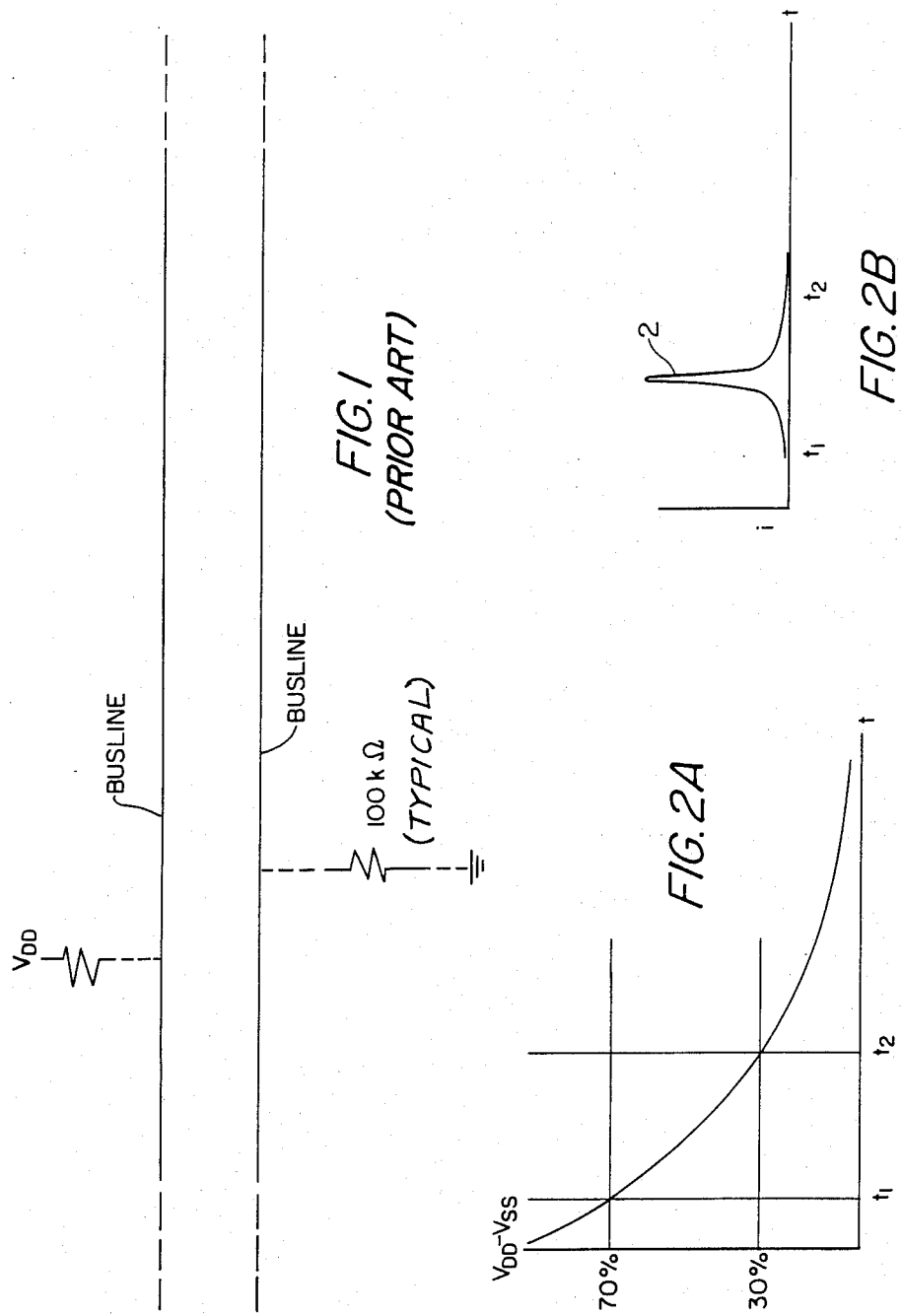

LEVEL CLAMP FOR TRI-STATE CMOS BUS STRUCTURE

This is a continuation of Ser. No. 849,049, filed on Mar. 7, 1986, now abandoned.

FIELD OF THE INVENTION

The present invention relates to bus lines, and more particularly to a level clamp for clamping a three-state CMOS bus line to the last state in which it was set.

BACKGROUND OF THE INVENTION

A bus in a CMOS system usually comprises a plurality of bus lines. A plurality of devices may be connected to each one of the bus lines. The devices connected to the bus line may have outputs which can be in any one of three possible states. The first of these states occurs when the output of the device is a low impedance path to the lower voltage rail (usually circuit ground), a condition commonly referred to as a logic "0" state. The output of the device is said to be in a second state if the device exhibits such a high impedance at its output that, as far as the other devices connected to the same bus line are concerned, it does not exist. The third possible state is when the output of the device is connected via a low impedance path to the upper voltage rail, a condition commonly referred to as a logic "1" state.

A CMOS bus line usually has connected thereto a number of buffer drivers for driving the bus line to one of the possible two low impedance states. If a bus line is not being driven by any one of the drivers for a protracted period of time, the bus line will start to drift from one particular logic state toward the other because of the inherent capacitance and leakages to ground and/or the upper rail. If the bus line is not held to either the drain or the source supplies, i.e. $V_{dd}$ or $V_{ss}$, the bus line could eventually drift into the range between 30 percent to 70 percent of $(V_{dd} - V_{ss})$, the so-called "forbidden zone." It is in this voltage zone that both the P and N channel input transistors of a CMOS gate connected to the bus may be caused to conduct simultaneously, as the bus line is floating between the two rails. This results in excessive current flow through and subsequent overheating of the input transistors connected to the bus line. A conventional method of correcting the aforesaid problems is to tie either a pull-up or a pull-down resistor to the bus. However, a tying resistor may cause a bus line to transit too slowly through the "forbidden zone," may drain too much power and may prevent the bus from being driven completely to a rail voltage.

BRIEF DESCRIPTION OF THE PRESENT INVENTION

The present invention avoids the aforesaid problems by using a combination non-inverting gate and feedback resistor for clamping a bus line to the last state to which it was set by an active driver. It is further envisioned that a CMOS circuit having high impedance outputs may be used as a substitute for the combination non-inverting gate and feedback resistor.

Thus, it is an object of the present invention to provide a discrete device for eliminating the heretofore-mentioned undesirable effects of using a tying resistor.

It is a further objective of the present invention to provide an active bus line clamp that would experience current drain only during the time necessary for the output voltage of the circuit to change from its initial state, which may be either a logic "0" or a logic "1", to its new state, which would now be either a logic "1" or a logic "0", respectively, in order to match a change in the logic state of its input.

It is yet a further objective of the present invention to provide a bus line clamp which would anchor the bus line at the state it was last set.

The above-mentioned objects and advantages of the present invention will become more apparent and the invention itself will be best understood by reference to the following description of an embodiment of the invention taken in conjunction with the accompanying drawing, wherein:

BRIEF DESCRIPTION OF THE FIGURES

FIG. 1 is an illustration of the conventional method of tying down a bus line;

FIG. 2A shows a curve representing the transition of a bus line from one rail to another rail when the bus line is not being driven by any of the drivers connected thereto;

FIG. 2B illustrates a current surge which may cause the overheating of devices connected to a bus line wherein the bus line is floating in or transiting through the "forbidden zone;"

DETAILED DESCRIPTION OF THE PRESENT INVENTION

The conventional method of holding or pulling an undriven bus line to either the $V_{dd}$ rail or the $V_{ss}$ rail is to connect either a pull-down or pull-up, respectively, resistor from the bus line to either one of the rails, per illustration in FIG. 1. This resistor has to have a fairly high impedance, say, for example, 100 k ohms. However, this technique has several problems. Firstly, because a substantially high impedance resistor is used, the transition of the bus line through the forbidden zone is slow. (Were the resistance of the resistor made too small, a different problem—that is, the ability of the bus line to be driven by the driver—would occur.) Secondly, there is a continuous drain of power through the resistor when the bus line is being held at the rail opposite to that to which the resistor is clamped. The third disadvantage of the conventional technique is that the bus line cannot be driven all the way to the rail that is opposite the one to which the resistor is connected. In addition, the value of the resistor used in the conventional method has to be a compromise between conflicting requirements. For example, the amount of current that a driver can supply to the rail through the resistor has to be balanced against the required output voltage level. Also, were the resistor to be connected to a battery-supported system or to a system which has inadequate heat sinking capability, the amount of current that can be expended on a steady state basis must be carefully allocated and controlled. Further, the time in which a bus line is driven through the "forbidden zone"

has to be kept to a minimum in order to prevent excessive current drain in the input stages of the P and N channel transistors of the CMOS gates. Hence, it is readily apparent that the conventional technique of tying either a pull-up or a pull-down resistor from the bus line to a rail has serious drawbacks.

FIG. 2A shows a curve representing the transition of a bus line from one rail, for example $V_{dd}$, to a second rail, for example $V_{ss}$, when the bus line is no longer being driven by any of the drivers connected thereto. As shown, in order for the bus line to transit from one rail to the other, it has to pass through the so-called "forbidden zone," designated on the $V_{dd}-V_{ss}$ ordinate between the area marked by 30–70 percent and on the time coordinate between the area designated by $T_1$ and $T_2$.

FIG. 2B shows that, during time period $T_1$ and $T_2$, a transient current peak 2 often occurs. If the bus line were to spend a relatively long period of time transiting between 70 percent and 30 percent, both the P and N channels of a CMOS device connected to the bus line would be turned on simultaneously for a relatively long time. And if the time between $T_1$ and $T_2$ is relatively long, the CMOS devices can be overheated by this high current peak.

Figure 3A:
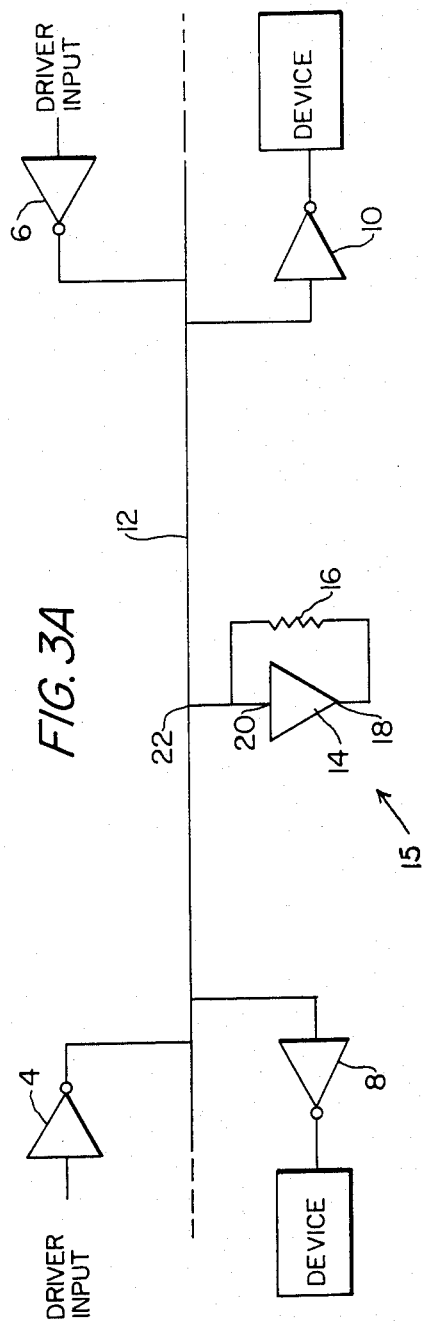
FIG. 3A shows a CMOS bus line having connected thereto drivers, inputs and the apparatus of the present invention.
Figure 3B:
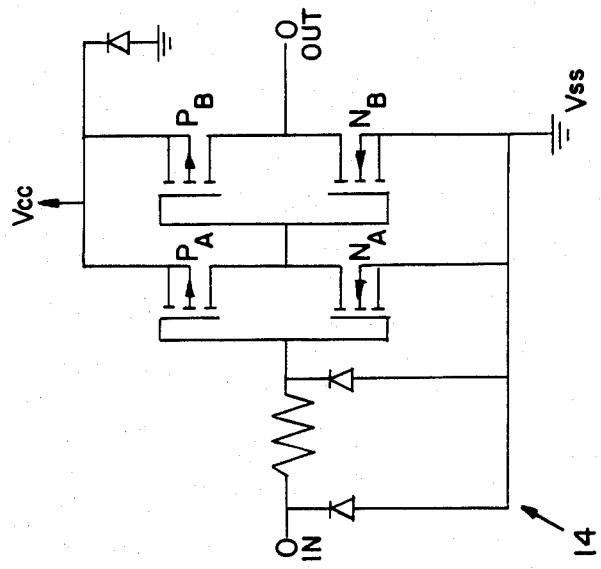
FIG. 3B is a schematic diagram of driver 14 illustrated in FIG. 3A.

An embodiment of the present invention for clamping the bus line into the last state in which it was driven is illustrated in FIG. 3A, wherein a bus line 12 is shown. Bus line 12 can be driven by any of a variety of devices with three-state outputs, for instance, drivers 4 and 6. As is well known, bus line 12 can drive a multiple number of CMOS devices, for example, inverters 8 and 10 shown connected thereto. As was mentioned previously, if only drivers and input devices are connected to the bus line, when the bus line is not being driven by any one of the drivers, it will tend to drift; and per chance that it enters the "forbidden zone," overheating of inverters 8 and 10 would result. To remedy this, the clamping device 15 of the present invention, which comprises a non-inverting driver 14 and a feedback resistor 16, is connected to bus line 12 at point 22. As can be seen, the two ends of resistor 16 are connected respectively to the output and the input of non-inverting driver 14. For the above discussion, it should be noted that drivers 4 and 6 are generic types of buffer drivers, for instance CD 4503B CMOS devices. Inverters 8 and 10 may be comprised of generic type CD 4049 inverters. As for the invention itself, non-inverting driver 14 may consist of a generic type CD 4050 CMOS device, the schematic diagram of which is shown in FIG. 3B, while resistor 16 may be presumed to have a resistance of approximately 20 k ohms. As shown in FIG. 3B, driver 14 has a first pair of low impedance transistors $P_A$ and $N_A$ connected to a second set of low power transistors $P_B$ and $N_B$. It should further be noted that the type of generic devices listed and the resistance value are not limiting, as they are shown for illustration purposes only.

The theory behind which the clamping device of the present invention works is as follows. Looking at non-inverting driver 14, it is presumed, as is well known, that a delay time, no matter how miniscule, does exist between the time that the non-inverting driver is initiated and the time that an output is sent forth from the same. For example, if bus line 12 is driven low, the input of non-inverter driver 14, designated as 20, would also go low. However, the output of non-inverter driver 14, designated by 18, would go low only after a certain amount of time has elapsed, as it takes a certain amount of time for the current to pass between the semiconductor junctions of the non-inverting driver. Hence, for that certain period of time, even though input 20 has gone low, output 18 remains high. As resistor 16 is connected to both the input and output of non-inverter driver 14, current drains through resistor 16 at this certain period of time until output 18 catches up with input 20.

Bearing the above discussion in mind, the clamp of the present invention works as follows. Suppose driver 4, which is assumed to be the only driver driving bus line 12, is finished with driving bus line 12 to the low state. As bus line 12 is not being driven by any other driver, it would try to move away from the state where it was set to a different state, as it is natural for a CMOS structure to drift because of the capacitance and leakages it inherently has. As soon as bus line 12 starts to drift from one state to the next, there is an immediate potential difference occurring between input 20 and output 18 of non-inverting driver 14. As a result, current drains through resistor 16. As the current draining through resistor 16 can far exceed the leakage current which is inherent in the CMOS system, it is apparent that the current draining through resistor 16 would tend to hold bus line 12 low. As the current which drains through resistor 16 is a function of the drift of bus line 12, there exists a positive feedback between the amount that bus line 12 is drifting and the amount of current which is drained by resistor 16. Thus, although bus line 12 is attempting to float away from the state in which it was last set—in this instance the low state, it would be prevented from achieving any meaningful displacement because of the current drain going through resistor 16.

Suppose instead of being low, bus line 12 is in a high state. The same result—that is, the bus line 12 would remain in substantially the last state in which it was set—would occur. For this case, bus line 12 has a tendency to float low. As there is a voltage potential difference between input 20 and output 18, current would go through resistor 16, thereby preventing the voltage potential at input 20 from differing materially from the voltage potential at output 18. Thus, the clamp of the present invention becomes self limiting very rapidly. The only criteria that must be appreciated in designing this clamp is that a value for resistor 16 has to be picked such that this value has to be sufficiently small in order to reliably hold bus line 12 down to the value of output 18 and yet sufficiently high so as not to materially slow down the transition of the bus line when it is being driven by some driver, for instance such as driver 4. It should also be noted that it is envisioned for the present invention that, instead of using a discrete non-inverting driver such as 14, a non-inverting device which already is connected to bus line 12 can also be utilized for this invention, as long as a feedback resistor having the value enunciated hereinbefore is attached by means of its two ends to the input and the output of such a non-inverting device. For this alternate method it must be imperative that the loads driven by the device chosen do not have sufficient drain to overcome the resistor which is to be connected thereto. In fact, the device chosen would not slow down the transition because of additional inherent capacitance therein. It is also envisioned that a CMOS circuit having standard inputs and high impedance outputs may be used in place of the combination non-inverting device and resistor.

Figure 4:
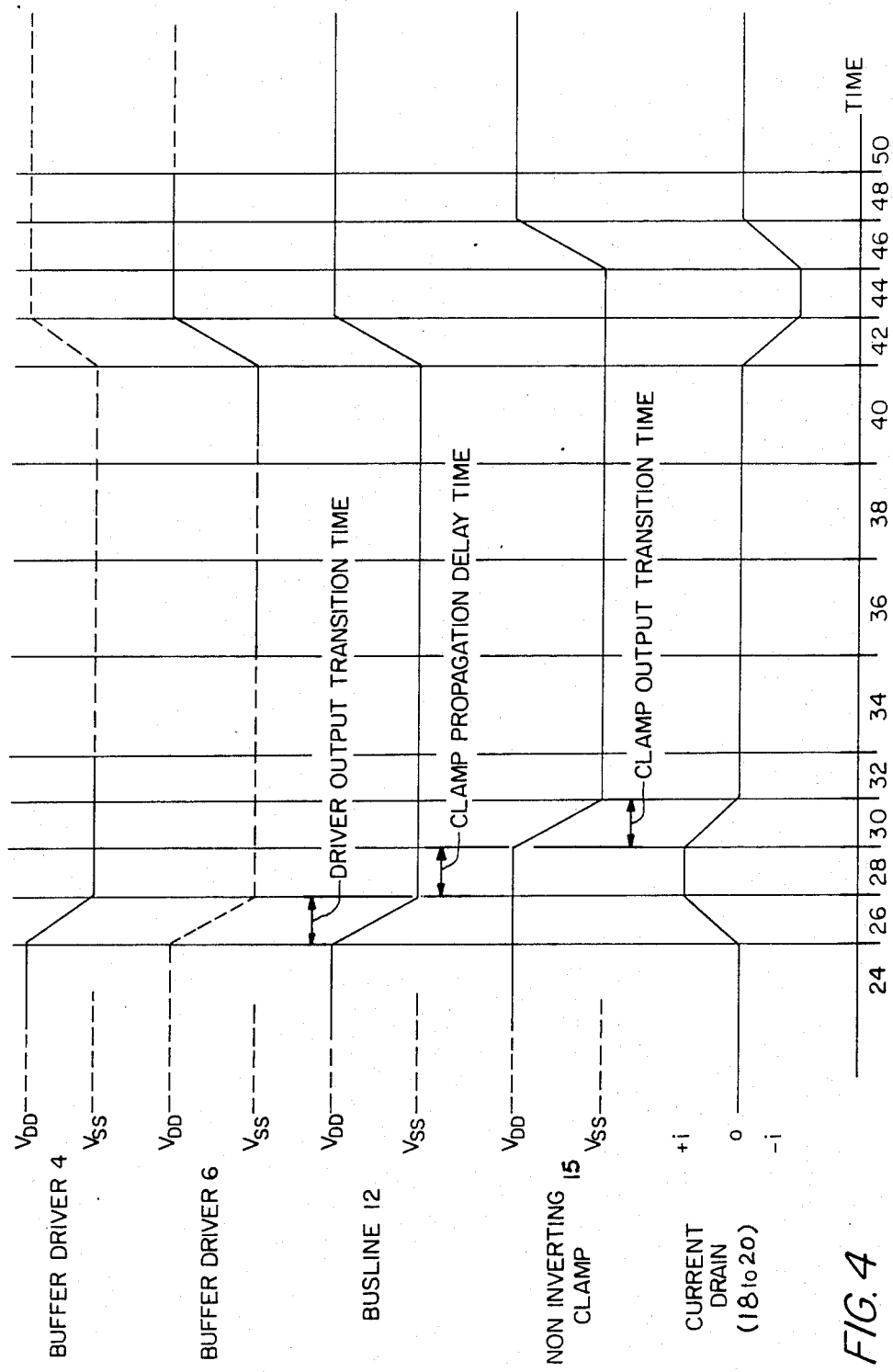
FIG. 4 is a timing and current flow diagram illustrating the operation of the present invention.

To further illuminate the invention, FIG. 4 provides a timing and current flow diagram to illustrate the operation of the clamp. As shown, the time base line has been divided into different periods, ranging from 24 to 50. Time period 24 designates the interval of initial condition period. At time 26, there is a change in the output of buffer driver 4 from a logic "1" to a logic "0" state. (For this example, it is presumed that a low state is being discussed.) As driver 4 goes from "1" to "0," bus line 12 also goes low. Period 28 represents a short time period of stability that may exist between the time that driver 4 reaches the logic "0" state and until the output of non-inverting clamp 15 starts to match the output of driver 4. Depending on the exact time of propagation delay through the non-inverting clamp and the speed of transition of driver 4, time interval 28 may or may not exist, i.e. if the transition time of driver 4 is relatively long compared with the propagation delay time of non-inverting clamp 15, time interval 28 may not exist. In other words, non-inverting clamp 15 may start to respond before driver 4 has gotten all the way to ground. During time period 30, the output of non-inverting clamp 15 changes. At time period 32, driver 4 has reached the logic "0" state and it continues to drive bus line 12 to ensure that stability exists in the system. Buffer driver 4 stops driving at period 34 and the system is now being held by the output of non-inverting clamp 15 through resistor 16. At time period 36 buffer driver 6 is turned on (by some computing means which is not shown). It drives to logic "0," at which state the system is already located. Hence, the system is not being affected thereby.

At time period 38 driver 6 is turned off. During this period, because of the clamping of bus line 12 by non-inverting clamp 15, the system remains at a period of stability, even though no driver is driving it; and bus line 12 has a tendency to drift, but is held by the clamp 15. At period 40 buffer 6 is again turned on. During period 42 it transits, changes state and the same condition as was discussed for driver 4, but for the forward slope, exists herein. A little while later, at period 44, a plateau representing a logic "1" state is reached by driver 6. Similarly, bus line 12 also reaches the logic "1" state. However, non-inverting clamp 15 has yet to respond. Beginning with and all through period 46, non-inverting clamp 15 climbs from the "0" state to the "1" state. During this time, driver 6 continues to drive bus line 12 so as to ensure that the system reaches a state of stability. At time period 48 such a state of stability is reached. At time period 50 buffer 6 is again turned off; but the system remains held in this state, that is "1," by non-inverting clamp 15 through resistor 16. Thus, it can be seen that the clamping device of the present invention does, indeed, hold the bus line to whichever state it was last set.

Consider now the current drain through resistor 16. For this discussion, the current drain is viewed as positive through resistor 16 when output 18 is positive in relation to input 20. At time period 26 non-inverting clamp 15 is stable, but bus line 12 is being driven by buffer driver 4. During this time, as driver 4 and bus line 12 depart from the upper rail, i.e. +5 volts, current starts to flow between input 20 and output 18. (It is during this time of transition that both the P and N channel input transistors of all CMOS circuits driven by the bus line are turned on simultaneously). Accordingly, current from output 18 is drained through resistor 16 until a condition of equilibrium is once again established between output 18 and input 20. This condition of equilibrium is not established until the end of time period 30. It is to be noted that when bus line 12 transits from the logic "1" condition—characterized as being at a voltage level, for example 5 volts—to a logic "0" condition—characterized as being at a voltage level of, for example 0 volt, conventional current flow is from the clamp output 18 through resistor 16 to input 20, which is electrically identical to bus line 12. When bus line 12 transits from a logic "0" to a logic "1", conventional current flow through resistor 16 is from clamp input 20, which is electrically identical to bus line 12, to clamp output 18. The output of non-inverting clamp 15 begins to change at the onset of time period 30 and continues to change therethrough. During this time period, there is a decline in the current drain through resistor 16, until no more current is drained beginning with time period 32. During time period 34, bus line 12 is not being driven by any buffer drivers; and as the system is in a state of virtual stability, only the current required to prevent bus line 12 from drifting substantially from its last set state is drained through resistor 16. This state of stability persists until the onset of time period 42, wherein bus line 12 is being driven from the low state to the high state by buffer driver 6. At this point, current again is drained across resistor 16, although in the opposite direction. During time period 44, driver 6 and bus line 12 remain high; and consequently, in order to catch up to this high state, maximum current drain through resistor 16 in the other direction occurs. The current drain slowly subsides with the onset of time period 46 as non-inverting clamp 14 now has caught up to the logic "1" state of bus line 12. As driver 6 stops driving bus line 12 beginning with time period 50, the system again is held in a state of virtual stability by clamp 15.

Figure 5:
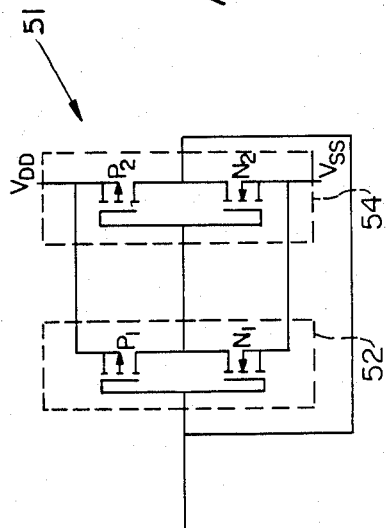
FIG. 5 shows an integrated circuit which may be used as an alternate embodiment of the present invention.

FIG. 5 shows a special non-inverting CMOS driver circuit 51 which may be used as a substitute for the combination non-inverting driver 14 and resistor 16 of the present invention. As shown, non-inverting driver 51 comprises two sets of P channel and N channel transistors, designated respectively as 52 and 54. As there is a double inversion, the output coming out of non-inverting driver 51 would reflect the state of the input. For this non-inverting driver, $P_1$ and $N_1$ are ordinary CMOS gates which are of high speed but low impedance. On the other hand, $P_2$ and $N_2$ are low-power gates which are not powerful enough to overcome and materially slow down any driver that may be driving bus line 12. Thus, by substituting circuit 15 of FIG. 3A with the special CMOS circuit 51 of FIG. 5, it should be appreciated that a feedback resistor, such as 16, would no longer be needed. It must be emphasized that the clamping function may be performed by any non-inverting gate, properly connected, and by any series combination of an even number of inverting gates, of one type or of mixed types, properly connected, or by any series combination of any number of non-inverting gates. A clamp may also be formed by appropriate series combinations of both inverting and non-inverting gates.

It should be understood that the invention is not limited to the exact details of construction shown and described herein, for obvious modifications will occur to persons skilled in the art.

I claim:

1. An active bus line clamp for clamping a multi-state bus line of a CMOS system to a particular logic level, the bus line being set to different logic levels by at least one driving means connected thereto, the level of the bus line tending to drift if not clamped and if the bus line is not being driven by the at least one driving means, the clamp comprising:

a non-inverting CMOS buffer driver connected to the bus line for tapping power therefrom, the power being represented as voltages at an input and an output of the buffer driver;

wherein the CMOS buffer driver comprises a first set of low impedance P and N transistors connected to a second set of low power P and N transistors; and a resistor having a first end connected to the input and a second end connected to the output of the buffer driver for limiting differences in the voltages between the input and the output of the buffer driver by draining current to or supplying current from the bus line, thereby automatically clamping the bus line at the logic level at which the bus line was last set by the driving means.

2. In a CMOS system having a three-state bus structure containing a plurality of bus lines having a tendency to drift from a first state to a second state, a plurality of drivers and gates connected to at least one of the bus lines, each of the drivers being adaptable to drive the bus line to different logic states each having a predetermined logic level voltage, an apparatus for clamping the bus line to a particular logic state, the apparatus comprising:

a non-inverting gate having an input tapped onto the bus line for sensing the logic level voltage existing therealong; and a resistor means, the two ends of which are connected to the input and an output, respectively, of the non-inverting gate, for regulating therethrough the flow of current to or from the bus line so as to maintain substantially identical voltages at the input and the output of the non-inverting gate;

wherein, if the logic level voltage on the bus line were to drift, the apparatus automatically clamps the voltage on the bus line to whatever logic level voltage it was last set by draining or sourcing current caused by the logic level voltage drift through the resistor means.

3. Apparatus as set forth in claim 2, wherein the non-inverting gate comprises a CMOS buffer driver.

4. An active bus line clamp for clamping a multi-state bus line of a CMOS system to a particular logic level, comprising:

a non-inverting buffer driver connected to the bus line for tapping power therefrom, the power being represented as voltages at an input and an output of the buffer driver; and a resistor having a first end connected to the input and a second end connected to the output of the buffer driver for automatically limiting differences in the voltages between the input and the output of the buffer driver by draining current to or supplying current from the bus line, thereby automatically clamping the bus line at whatever logic level it was last driven by any one of a plurality of drivers connected to the bus line, the drivers adapted to drive the bus line to different logic levels.

* * * * *